US012699137B2

(12) United States Patent
Sri et al.

(10) Patent No.: US 12,699,137 B2
(45) Date of Patent: Aug. 4, 2026

(54) DEFECT ANALYSIS OF ELECTRIC MOTORS USING REFERENCE FRAMES (DQZ COMPONENTS)

(71) Applicant: Tektronix, Inc., Beaverton, OR (US)

(72) Inventors: Krishna N H Sri, Bengaluru (IN);
Niranjan R Hegde, Siddapur (IN);
Shubha B, Bengaluru (IN);
Christopher J. Loberg, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 297 days.

(21) Appl. No.: 18/629,865

(22) Filed: Apr. 8, 2024

(65) Prior Publication Data

US 2024/0345166 A1 Oct. 17, 2024

(30) Foreign Application Priority Data

Apr. 11, 2023 (IN) .............................. 202321026736

(51) Int. Cl.
*G01R 31/34* (2020.01)

(52) U.S. Cl.
CPC .................................. *G01R 31/343* (2013.01)

(58) Field of Classification Search
CPC .................................................... G01R 31/343
USPC .................................................... 324/765.01
See application file for complete search history.

(56) References Cited

U.S. PATENT DOCUMENTS

| | | | |
|---|---|---|---|
| 2013/0013138 A1* | 1/2013 | Lu | B60L 3/0061 |
| | | | 702/34 |
| 2017/0102425 A1 | 4/2017 | Hao et al. | |
| 2021/0013818 A1* | 1/2021 | Vasudev | H02P 21/0003 |
| 2022/0413051 A1* | 12/2022 | Adiga | G01R 31/343 |

OTHER PUBLICATIONS

Manop et al., "Stator faults detection based on the dq0 voltage components," 2008 IEEE International Conference on Industrial Technology, Chengdu, China, 2008, pp. 1-5, doi: 10.1109/ICIT.2008.4608400.

(Continued)

*Primary Examiner* — Roberto Velez
(74) *Attorney, Agent, or Firm* — Miller Nash LLP; Andrew J. Harrington

(57) ABSTRACT

A test and measurement instrument includes one or more processors to acquire first, second, and third phase drive signals applied to a three-phase motor. A motor drive analyzer performs a direct-quadrature-zero, DQZ, transformation on the acquired first, second, and third phase drive signals to produce direct (D), quadrature (Q), and zero (Z) components, and generates an overlapped DQ phasor plot illustrating the D and Q components along with frequency domain representations of the D and Q components. The motor driver analyzer displays, on a user interface, the generated overlapped DQ phasor plot and an overlapped DQ spectra plot from the frequency domain representations of the D and Q components to enable a user to detect motor defects through visual characteristics of the overlapped DQ phasor and DQ spectra plots. The motor driver analyzer removes an offset and filters the D and Q components prior generating the overlapped DQ phasor plot.

20 Claims, 11 Drawing Sheets

(56)  References Cited

OTHER PUBLICATIONS

Nandi et al. , "Novel frequency-domain-based technique to detect
stator interturn faults in induction machines using stator-induced
voltages after switch-off," in IEEE Transactions on Industry Appli-
cations, vol. 38, No. 1, pp. 101-109, Jan.-Feb. 2002, doi: 10.1109/
28.980363.

* cited by examiner

FIG. 3

DEFECT ANALYSIS OF ELECTRIC MOTORS USING REFERENCE FRAMES (DQZ COMPONENTS)

CROSS-REFERENCE TO RELATED APPLICATIONS

This disclosure claims priority under 35 U.S.C. § 119 to Indian Provisional Patent Application No. 202321026736, filed Apr. 11, 2023, titled "DEFECT ANALYSIS OF AC/DC MOTORS USING REFERENCE FRAMES (DQ0 COMPONENTS)," the disclosure of which is incorporated herein by reference in its entirety.

TECHNICAL FIELD

The disclosure relates generally to induction motors, and more specifically to the capture, processing, and display of time and frequency domain motor drive signals on a test and measurement instrument to detect defects in induction motors.

BACKGROUND

Induction motors are used in a wide variety of applications, with three-phase induction motors being particularly prevalent in industrial applications. An induction motor includes a stator having a number of coils typically formed by an insulated wire wound around a core of the stator. The coils are configured to provide electromagnetic poles for generating a rotating magnetic field in response to time-varying or AC electrical signals applied to the poles. The poles to collectively generate the rotating magnetic field, which rotates about a central axis of the stator. A current is induced in the rotor in response to the rotating magnetic field generated by the stator. The rotor is rotatable about the central axis and the induced current in the rotor results in torque on the rotor that causes rotation.

A variety of different types of faults or defects may occur in an induction motor during manufacture or operation, such as stator winding irregularities, rotor imbalance, and electrical coupling, load, efficiency, and rotor bearing irregularities. For example, the windings or turns of insulated wire forming each coil of the stator may electrically short together if the insulation is damaged, which will adversely affect the operation of the motor. Currently, the most commonly used technique for detecting defects in the operational characteristics of induction motors without interrupting manufacture of the motors is a technique known as Motor Current Signature Analysis (MCSA). MCSA senses the currents of drive signals applied to an induction motor and enables the detection of motor defects through these sensed currents. While effective for detecting defects in induction motors, MCSA typically utilizes advanced algorithms that are relatively complex to implement. Therefore, improved techniques for detecting faults in induction motors are desirable.

BRIEF DESCRIPTION OF ACCOMPANYING DRAWINGS

FIG. 3 is a signal diagram showing three-phase stator drive signals displayed on a test and measurement instrument for a stator of an induction motor having no defects.

DETAILED DESCRIPTION

Embodiments of the disclosure are directed to methods of detecting defects in induction motors using a motor drive analyzer in a test and measurement instrument for testing the induction motors, and to systems for implementing these methods in accordance with some embodiments of the disclosure. The motor drive analyzer captures, processes, and displays time and frequency domain motor drive signals on the test and measurement instrument to enable a user to detect defects in the induction motor being tested. The methods and systems according to embodiments of the disclosure enable visualization of drive signals characterizing operation of an induction motor, which enables early detection of defects and allows a user to take appropriate actions to prevent further damage to the motor that may result from continued operation of the motor. For example, where a coil of a stator of the induction motor includes electrically short-circuited coil turns or windings, the early detection of these short-circuited coil turns or windings may eliminate damage to adjacent coils of the stator that may otherwise result from continued operation of the induction motor, reducing repair costs and outage or repair time for the motor. The visualization provided by embodiments of the present disclosure enables a user to identify a defective induction motor through visual characteristics of the displayed drive signals such as particular shapes of the displayed signals and the presence of specific frequency components in the frequency domain signals.

Figure 1:
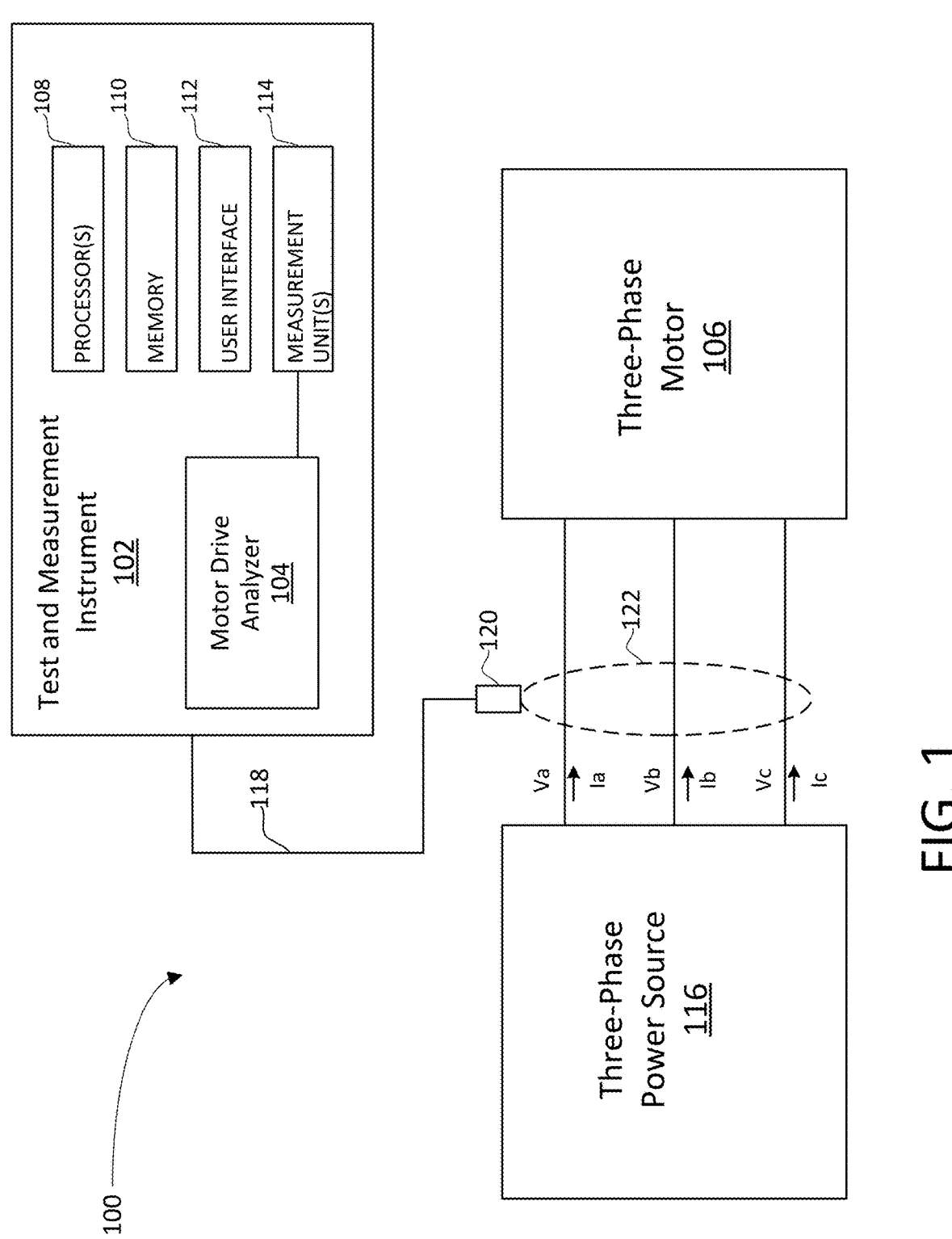
FIG. 1 illustrates a test and measurement system including a test and measurement instrument including a motor drive analyzer for use in testing and detecting defects in induction motors in accordance with some embodiments of the disclosure.

FIG. 1 illustrates a test and measurement system 100 including a test and measurement instrument 102 including a motor drive analyzer 104 for use in testing and detecting defects in a three-phase motor 106 in accordance with some embodiments of the disclosure. The motor 106 may be different types of AC motors as well as brushless DC (BLDC) motors in embodiments of the test and measurement system 100. Embodiments of the disclosure are described in more detail in relation to the three-phase motor 106 being an induction motor by way of example, but are not limited to detecting defects in this type of motor. Embodiments of the disclosure may also detect defects in different types of AC and BLDC motors. The test and measurement instrument 102 includes one or more main processors 108 that may be configured to execute instructions from main memory 110 and may perform any methods and/or associated steps indicated by such instructions. A user interface 112 is coupled to the one or more processors 108 and may include, for example, a keyboard, mouse, touchscreen, output display, file storage, and/or any other controls employable by a user to interact with the test and measurement instrument 102. In some embodiments the user interface 112 may be connected to or controlled by a remote interface (not illustrated), so that a user may control operation of the instrument 102 in a remote location physically away from the instrument. A display portion of the user interface 112 may be a digital screen such as an LCD, or any other monitor to display waveforms, measurements, and other data to a user. In some embodiments, the main output display of the user interface 112 may also be located remote from the instrument 102.

One or more measurement units 114 perform the main functions of measuring parameters and other qualities of signals from the device 106 being measured by the instrument 102. Typical measurements include measuring voltage, current, and power of input signals in the time domain, as well as measuring features of the signals in the frequency domain. The measurement units 114 represent any measurements that are typically performed on test and measurement instruments, and the motor drive analyzer 104 may be integrated within or coupled to such measurement units 114.

A three-phase power source 116, which would typically be an AC mains power source, provides phase drive signals in the form of phase drive voltage signals Va, Vb, Vc and phase drive current signals Ia, Ib, Ic to drive the induction motor 106. The test and measurement instrument 102 is coupled through suitable cables 118 and probes 120 to acquire the phase drive signals Va, Vb, Vc and Ia, Ib, Ic applied to the induction motor 106. This coupling to the phase drive signals is represented through the dashed line 122 in FIG. 1.

In operation, the test and measurement instrument 102 captures or acquires the phase drive signals Va, Vb, Vc and Ia, Ib, Ic and performs the direct-quadrature-zero transformation on these drive signals to generate corresponding direct D, quadrature Q, and zero Z components. Each D, Q, and Z component is a time-domain signal. The DQZ transformation is a vector transformation that converts the three-phase time varying drive signals Va, Vb, Vc and Ia, Ib, Ic into time-invariant DC components in the form of the DQZ components, and is formed by the combination of the Park and Clarke transformations, as will be appreciated by those skilled in the art. The DQZ transformation simplifies analysis of rotating machines such as the three-phase motor 106 being tested in example embodiments of the disclosure. In the present description and the accompanying figures, the DQZ transformation or transform may also be referred to as the DQ0 transform. Once the motor drive analyzer 104 has applied the DQZ transform to generate the D, Q, and Z components corresponding to the phase drive signals (Va, Vb, Vc and Ia, Ib, Ic) in the ABC reference frame, the motor drive analyzer then processes the D, Q, and Z components and displays the results of this processing to enable a user to detect defects in the induction motor 106, as will be described in more detail below.

In some embodiments of the test and measurement system 100 the three-phase motor 106 is a BLDC motor. In these embodiments, the three-phase power source 116 would provide first, second, and third DC pulse drive signals for each of the first, second, and third phase drive signals. Each of the first, second, and third DC pulse drive signals would be formed by a series of DC pulses having alternating polarities. The DC pulses forming the first, second, and third DC pulse drive signals are phase shifted or offset in time relative one another. One skilled in the art will understand the operation of BLDC motors and suitable DC pulse drive signals forming the first, second, and third phase drive signals for a BLDC motor.

Figure 2:
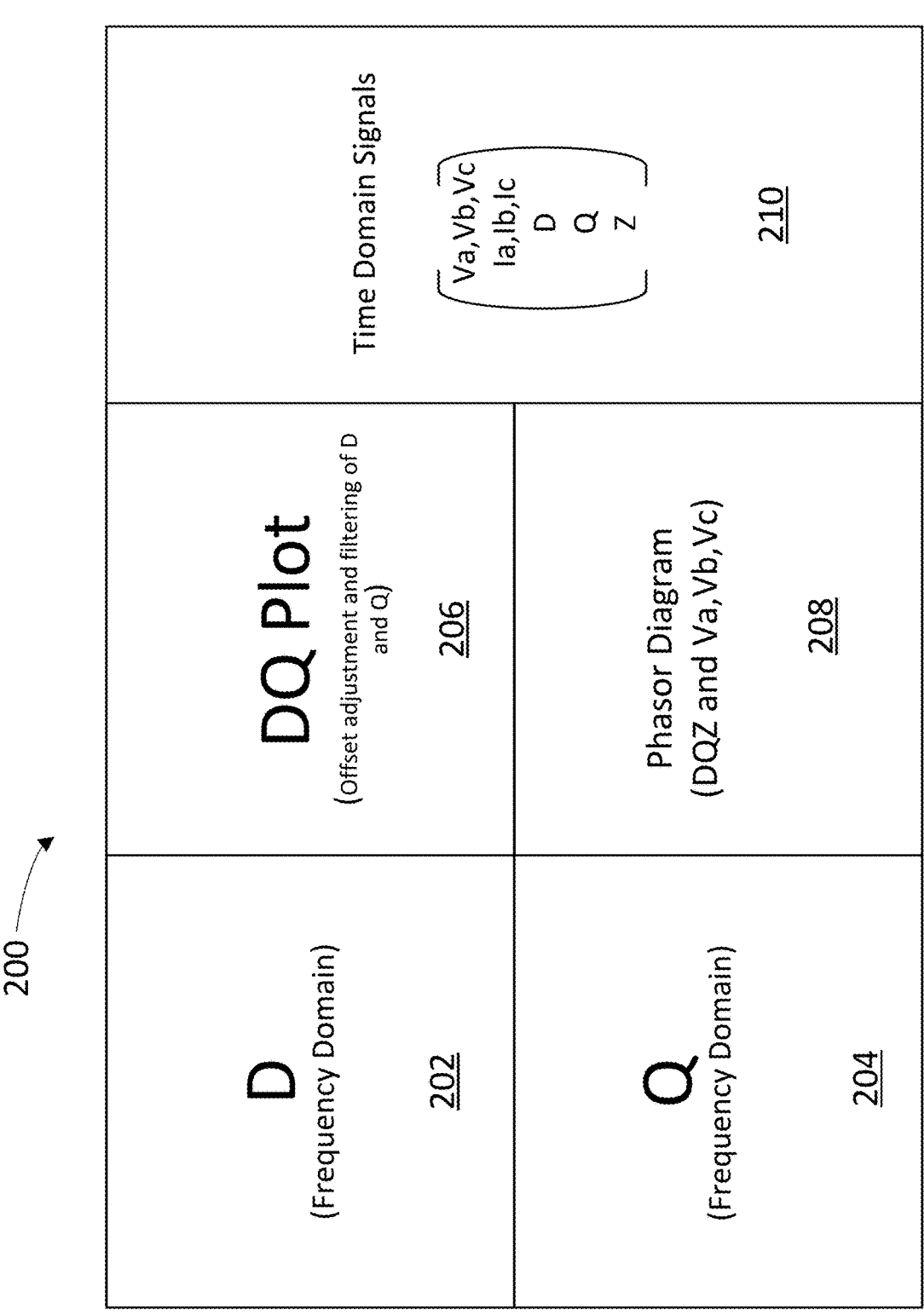
FIG. 2 is an example display rendered by a user interface of the test and measurement instrument of FIG. 1 that shows various operating parameters of an induction motor that are visually presented to enable detection of defects of the motor in accordance with some embodiments of the disclosure.

FIG. 2 is an example display 200 rendered by the user interface 112 of the motor drive analyzer 104 of FIG. 1 and visually shows various operating parameters of the induction motor 106 that are generated through the processing of the D, Q, and Z components by the motor drive analyzer. This visual presentation of the calculated or generated operating parameters enables a user to detect one or more faults or defects in the induction motor 106. The display 200 includes a frequency domain representation 202 of the D component in the upper left and a frequency domain representation 204 of the Q component in the lower left. Each of the D and Q components calculated by the motor drive analyzer 104 is a time domain signal and the motor drive analyzer processes these time domain signals to generate the frequency domain representations 202 and 204 for the D and Q components. To generate the frequency domain representations 202 and 204, the motor drive analyzer 104 calculates, for example, the Discrete Fourier Transform (DFT) or Fast Fourier Transform (FFT) of the D and Q components in the time domain. Spectral components having sufficient magnitudes at certain frequencies in the D and Q frequency domain representations 202, 204 may indicate a defect in the motor 106. This will be described in more detail below with reference to FIGS. 7-9. These frequency domain representations 202, 204 may also be referred to as overlapped DQ spectra plots when displayed superimposed in the same plot as shown and discussed in more detail below with reference to FIGS. 7 and 8.

The display 200 further includes a DQ plot 206, which is a plot of the D component versus the Q component. The DQ plot 206, as well as additional DQ plots discussed below, may also be referred to as overlapped DQ phasor plots in the present description. The DQ plot illustrates variation in the D component relative to the Q component, with the rate of change of the D and Q components indicating defects in the motor 106. The DQ plot 206 will have a certain general shape when the induction motor 106 has a defect and a different general shape when the motor has no defects. As a result, the visual display of the DQ plot 206 in the display 200 enables a user to visually detect such defects. In generating the DQ plot 206, the motor drive analyzer 104 calculates an offset Doff for the D component and an offset Qoff for the Q component. Prior to generating the DQ plot 206, the motor drive analyzer 104 then adjusts the D and Q components by removing the calculated offset Doff, Qoff, from these components to generate offset-adjusted D and Q components. In addition, prior to generating the DQ plot 206, the motor drive analyzer 104 filters the offset-adjusted D and Q components to remove unwanted noise. In further example embodiments, the motor drive analyzer 104 generates a three-dimensional DQZ plot for the plot 206, with each of the D, Q, and Z components being offset adjusted and filtered as described above. The DQ plot 206 along with the calculation of the offsets Doff and Qoff and adjustment of the D and Q components, as well as the filtering of the D and Q components, will be described in more detail below with reference to FIGS. 5 and 6.

A phasor diagram 208 is included in the display 200 in the example embodiment of FIG. 2. The phasor diagram 208 illustrates vectors for the Va, Vb, Vc drive signals along the D, Q, Z components and a resultant vector R of the D, Q, Z components, as will be discussed below in more detail with reference to FIG. 10. As with the DQ plot 206, the phasor diagram 208 has a shape or visual characteristics that indicate whether the induction motor 106 has a defect, which will also be discussed in more detail below with reference to FIG. 10. Finally, the display 200 includes the time domain signals 210 in the example of FIG. 2. These time domain signals 210 include the captured or acquired phase drive signals Va, Vb, Vc, and Ia, Ib, Ic, as well as the corresponding D, Q, and Z components. The arrangement of the plots and signals 202-210 in the display 200 is one example arrangement of components generated for display by the motor drive analyzer 104, and the display may include alternative arrangements including fewer than all of these components or including additional components in further embodiments.

Figure 3:
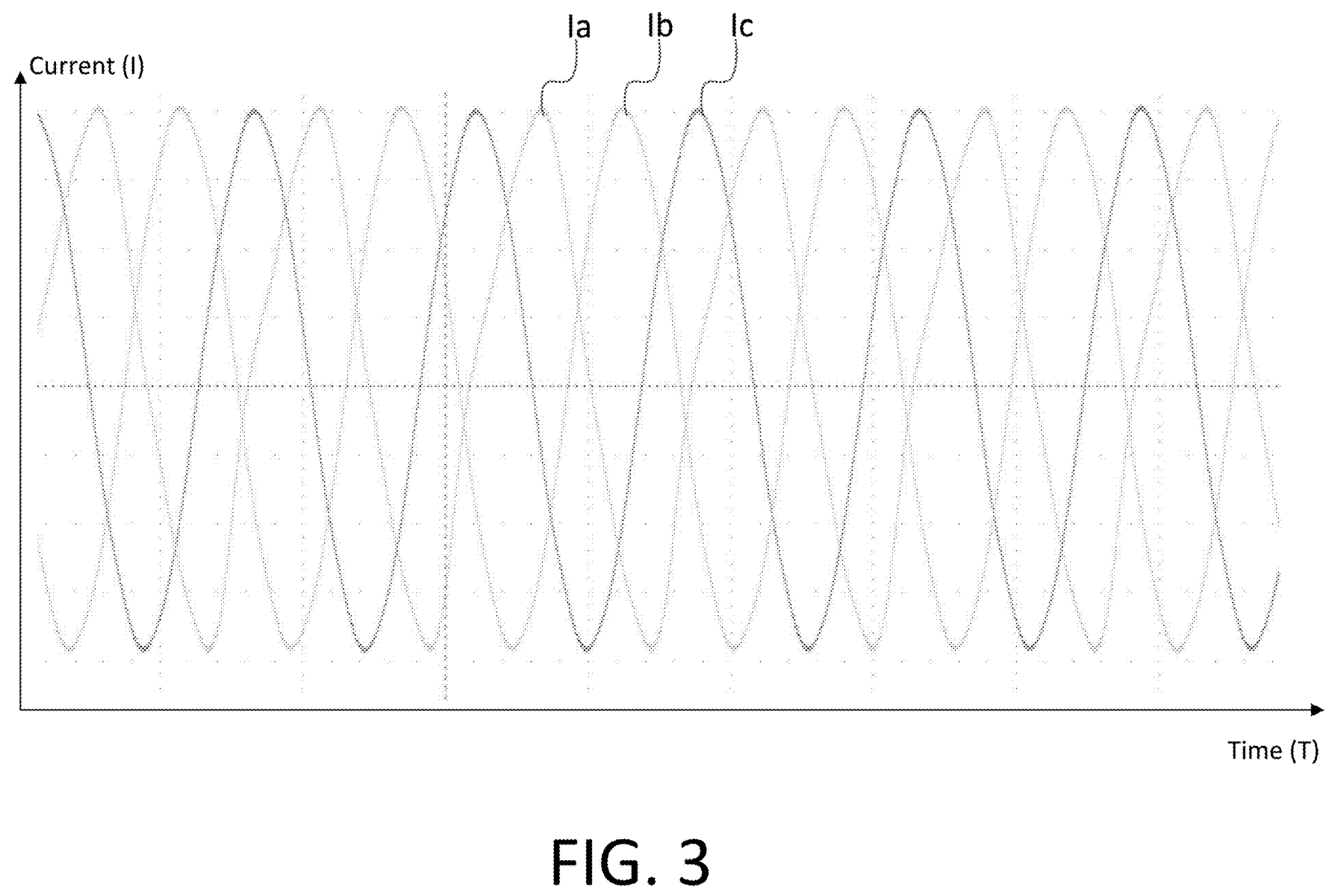
Figure 4:
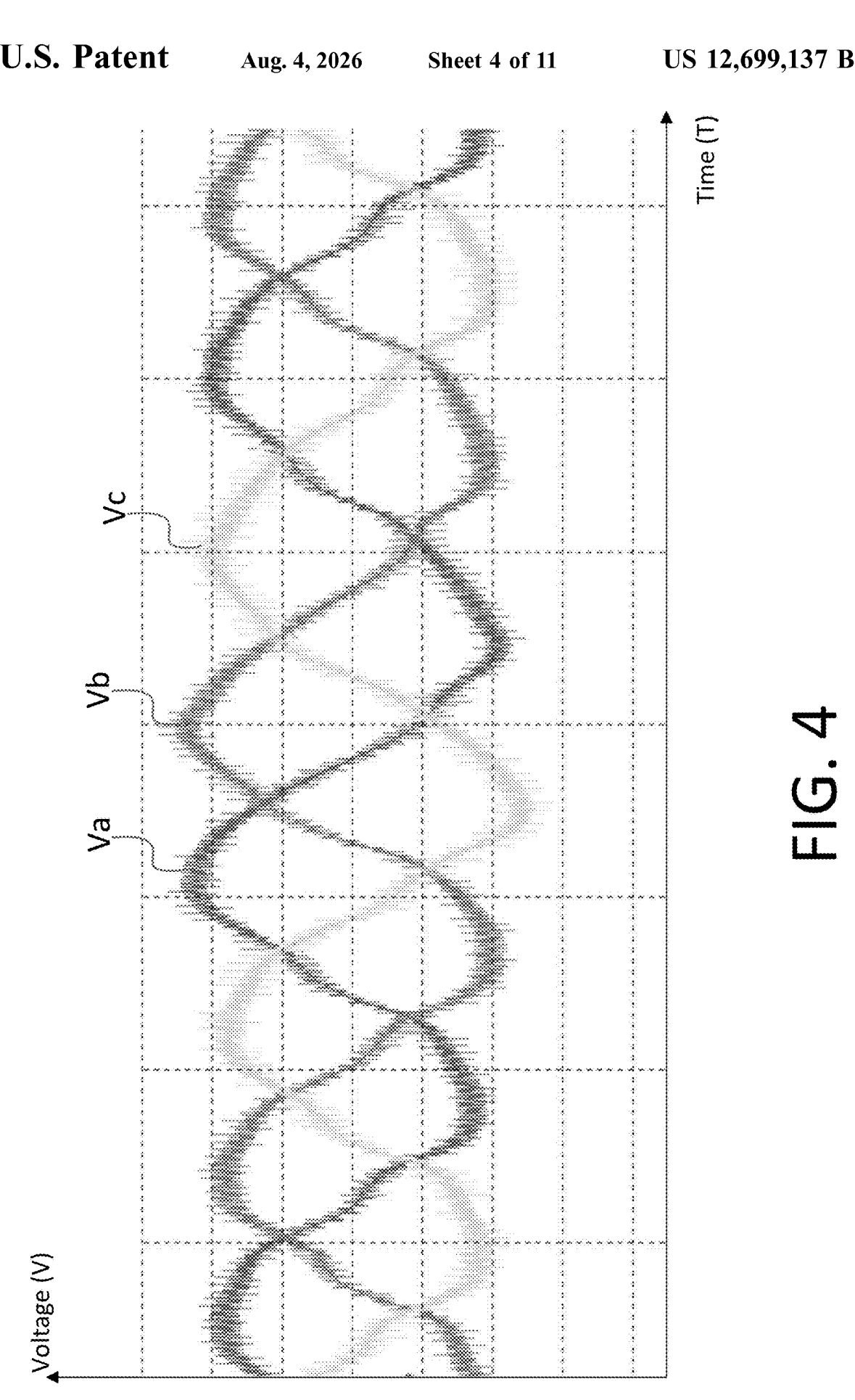
FIG. 4 is a signal diagram showing three-phase stator drive signals displayed on a test and measurement instrument for a stator of an induction motor having a defect or fault.

FIG. 3 is a signal diagram showing three-phase stator drive signals in the form of current drive signals Ia, Ib, Ic displayed on a test and measurement instrument for a stator of an induction motor having no defects. The current drive signals Ia, Ib, Ic are seen to be sinusoidal signals having the approximately the same amplitudes and a phase shift (120 degrees) between the signals. In contrast, FIG. 4 shows stator drive signals for a faulty or defective induction motor. FIG. 4 shows voltage drive signals Va, Vb, Vc that ideally would be sinusoidal signals having the same phase shift as for the current drive signals Ia, Ib, Ic of FIG. 1. Instead, the drive signals Va, Vb, Vc have varying amplitudes, indicating a defect in an induction motor being driven by these signals. FIGS. 3 and 4 illustrate how the drive signals of an induction motor will vary depending on whether the motor is a healthy motor (i.e., a motor having no defects) or is a faulty or defective motor, and how the motor drive analyzer 104 (FIG. 1) enables the detection of such defects through visual display of the drive signals of the motor.

Figure 5:
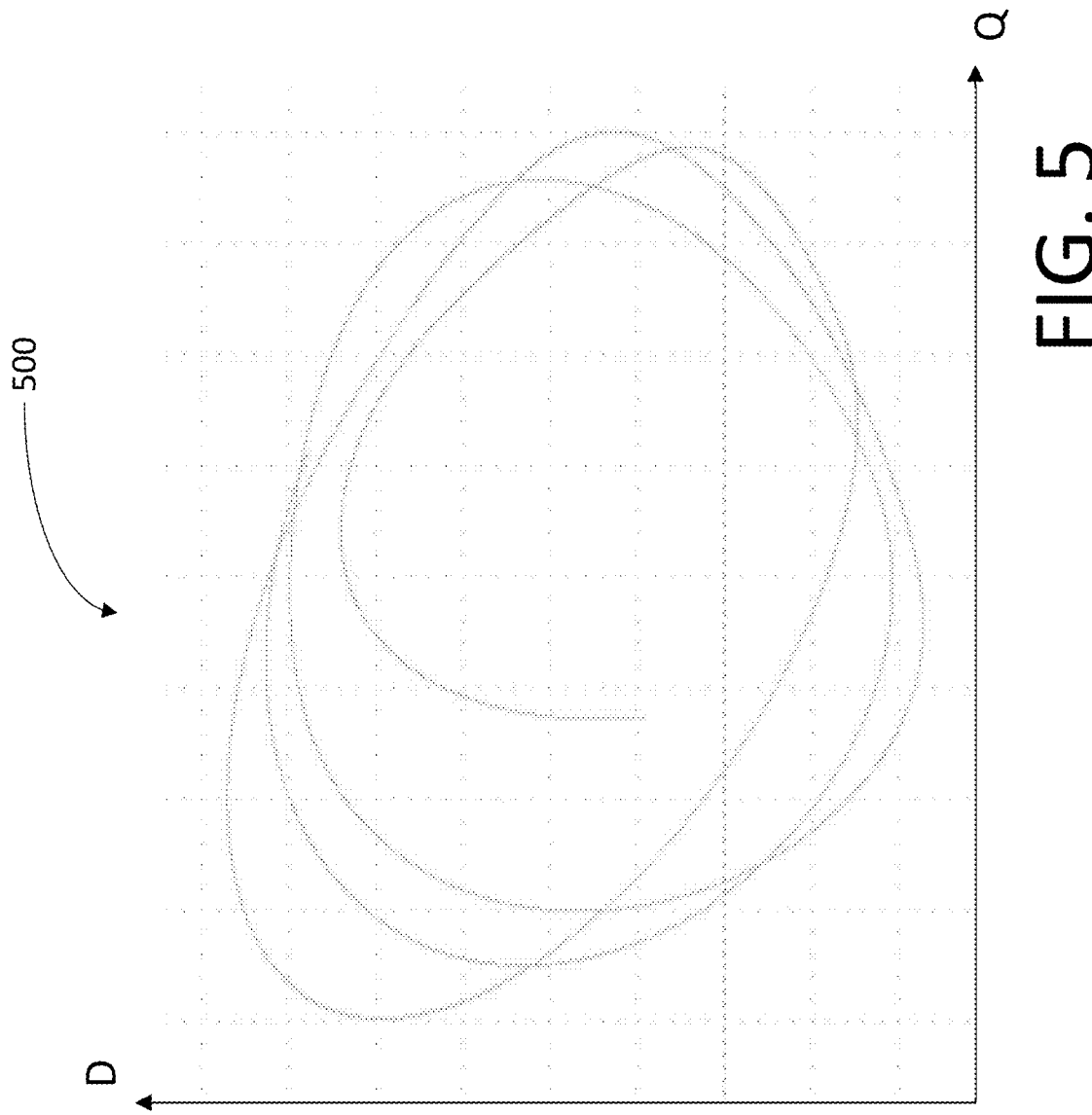
FIG. 5 is a plot generated by the motor drive analyzer of FIG. 1 illustrating the direct component relative to the quadrature component for a defective or faulty induction motor in accordance with some embodiments of the disclosure.

FIG. 5 is a DQ plot 500 generated by the motor drive analyzer 104 of FIG. 1 for a defective or faulty induction motor in accordance with some embodiments of the disclosure. The DQ plot 500 may also be referred to as an overlapped DQ phasor plot in the present description. The DQ plot 500 shows the direct component D on the vertical axis and quadrature component Q on the horizontal axis. The DQ plot 500 is an example of the DQ plot 206 in the display 200 of FIG. 2. The DQ plot 500 shows the D component relative to the Q component for the motor 106 of FIG. 1 when the motor has a defect or fault such as electrically short-circuited windings in one or more coils of the stator. The DQ plot 500 of FIG. 5 is in contrast to a DQ plot 600 of FIG. 6 generated by the motor drive analyzer 104 when the induction motor 106 is a healthy induction motor including no such stator faults or defects. The DQ plot 600 may also be referred to as an overlapped DQ phasor plot in the present description. The DQ plot 600 is seen to have a more circular shape compared to DQ plot 500, enabling a user to identify whether the motor 106 is a defective or healthy the motor 106 by the shape or visual characteristics of the DQ plot 500, 600 generated by the motor drive analyzer 104. In some embodiments of the disclosure, a user may utilize the user interface 112 (FIG. 1) to define a mask including mask coordinates, and based on mask definition motor (rotor windings) may be analyzed for being in a faulty state or in a healthy state. A user may define worst case mask coordinates by looking at the FFT of the D and Q components, and use this for both load dynamic and steady state (i.e., longer) operations.

Figure 6:
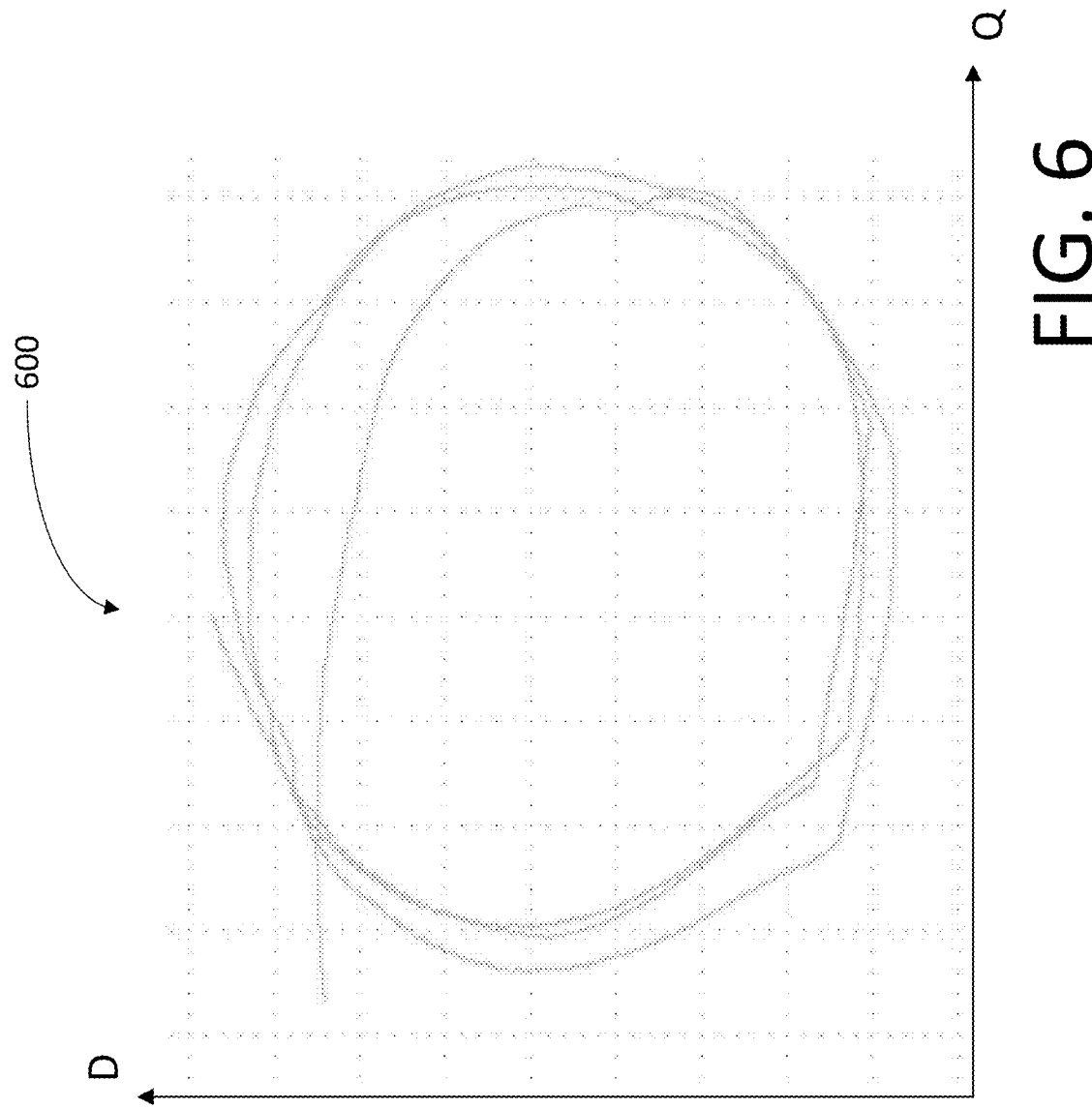
FIG. 6 is a plot generated by the motor drive analyzer of FIG. 1 illustrating the direct component relative to the quadrature component for a healthy induction motor in accordance with some embodiments of the disclosure.

In FIGS. 5 and 6 as well as the following FIGS. 7-11, the motor drive analyzer 104 is described as generating, rendering, or displaying the particular plot or display illustrated in each of these figures. To display these various displays or plots, the motor drive analyzer 104 typically uses the user interface 112 (FIG. 1) of the test and measurement instrument 102 in which the motor drive analyzer executes or is implemented. The motor drive analyzer 104 is described in the present description as providing these plots and displays for case of description, even though the plots and displays of the motor drive analyzer are provided through the separate user interface 112 of the test and measurement instrument 102. The motor drive analyzer 104 may include a user interface for displaying these plots and displays in embodiments of the disclosure.

The DQ plots 500, 600 illustrate the offset adjusted and filtered D and Q components generated by the motor drive analyzer 104. This offset adjustment and filtering was mentioned above in relation to the DQ plot 206 of FIG. 2. In operation, the motor drive analyzer 104 calculates the D and Q components for the motor 104, but then, prior to generating the corresponding DQ plot for these calculated D and Q components, the motor drive analyzer first adjusts the calculated D and Q components of the motor 106 by removing a calculated offset Doff, Qoff, from these components to generate offset-adjusted D and Q components. In addition, prior to generating the DQ plot for the calculated D and Q components, the motor drive analyzer 104 then filters the offset-adjusted D and Q components to remove unwanted noise. The DQ plots 500, 600 of FIGS. 5 and 6 illustrate the respective DQ plot for the offset-adjusted and filtered D and Q components of the motor 106 as calculated or generated by the motor drive analyzer 104.

The operation of the motor drive analyzer 104 in determining the offsets Doff, Qoff for the D and Q components, performing the offset adjustment of these components, and then filtering the offset-adjusted components will now be described in more detail. The motor drive analyzer 104 utilizes the following equation to calculate the offset adjustment for the D component:

$$DoffsetAdj = Dwfm - \text{mean}(Dwfm) \qquad \text{EQN 1}$$

where Dwfm corresponds to the initial D component calculated by the motor drive analyzer 104, the mean (Dwfm) is the mean or average of the set of digital values forming the initial D component, and DoffsetAdj is the offset-adjusted D component. The mean (Dwfm) in EQN1 corresponds to the offset Doff discussed above. Through equation EQN1 the motor drive analyzer 104 generates the offset-adjusted D component DoffsetAdj. The offset mean (Dwfm) of the D component Dwfm needs to be compensated for before generating the corresponding DQ plot or else multiple unwanted circles may result in the plot.

The motor drive analyzer 104 does the same compensation to adjust the initially calculated Q and Z components from the DQZ transform performed by the motor drive analyzer 104 as discussed above. Thus, in addition to the offset-adjust D component, the motor drive analyzer 104 calculates an offset-adjusted Q component QoffsetAdj and offset-adjusted Z component ZoffsetAdj using equations similar to EQN1. As mentioned above, although the two-dimensional DQ plots are shown in FIGS. 5 and 6, the motor drive analyzer 104 generates three-dimensional DQZ plots in some embodiments of the disclosure and in these embodiments each of the D, Q, and Z components must be adjusted using equation EQN1.

In addition to performing offset adjustment, the motor drive analyzer 104 filters the offset-adjusted D, Q, and Z components prior to generating the corresponding DQ or DQZ plot. After the motor drive analyzer 104 has removed the offset of the D component through equation EQN1, the offset-adjusted D component is filtered by implementing the following equation:

$$Dofiltered = MAV(DoffsetAdj) \qquad \text{EQN 2}$$

where Dofiltered is the filtered offset-adjusted D component and MAV(DoffsetAdj) is the moving average of the offset-adjusted D component from equation EQN1. This filtering allows users to apply a digital filter, which is implemented through a moving average in equation EQN2, to remove unwanted noise on the D component. The same filtering is done for the Q and Z components. Different types of digital filters may be utilized in different embodiments of the motor drive analyzer 104, such as a low order infinite impulse response (IIR) filter.

Figure 7:
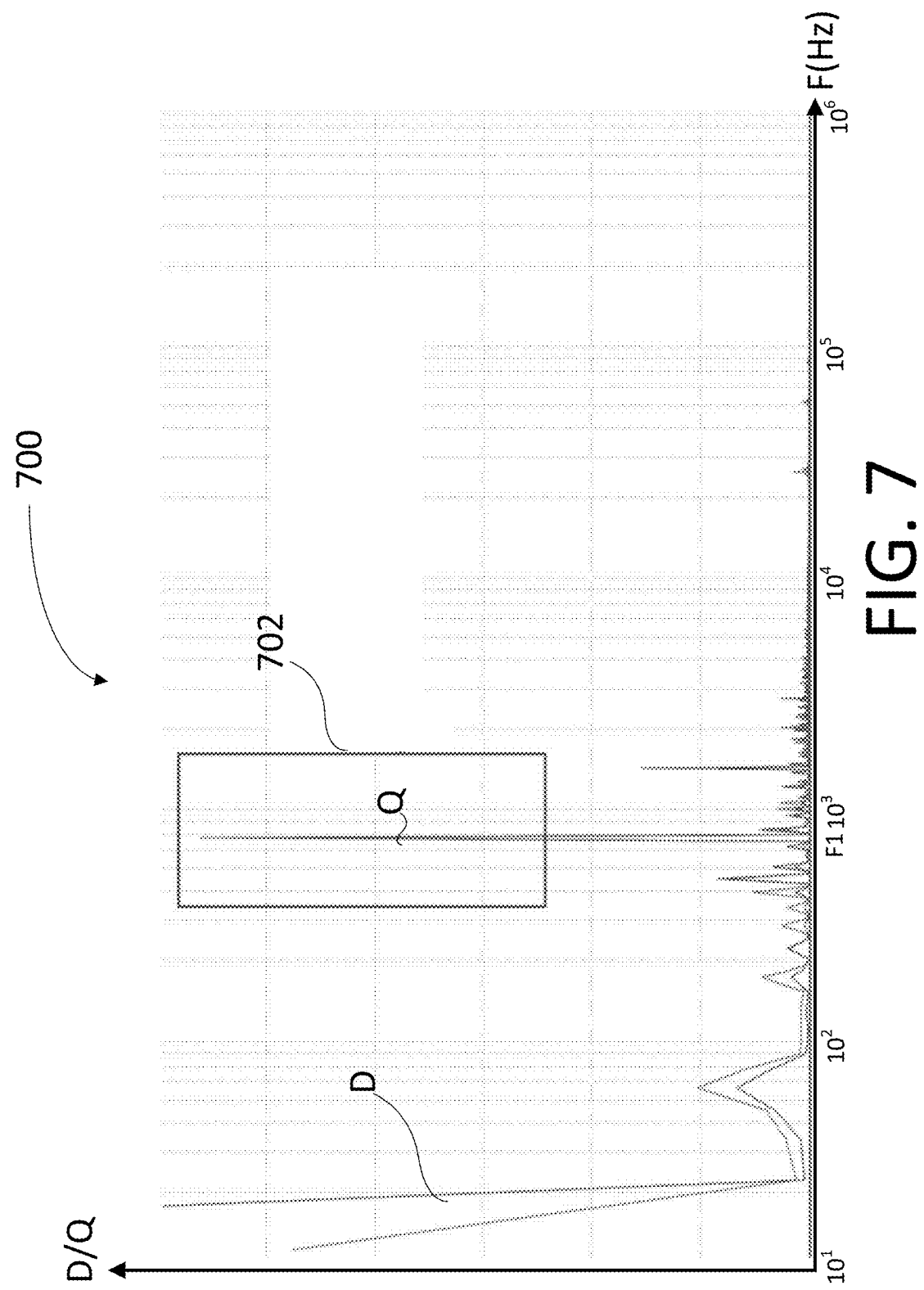
FIG. 7 is a plot generated by the motor drive analyzer of FIG. 1 illustrating the frequency spectra of the direct and quadrature components for a defective or faulty induction motor in accordance with some embodiments of the disclosure.

FIG. 7 is a frequency domain plot 700 generated by the motor drive analyzer 104 of FIG. 1 illustrating the frequency spectra of the direct D and quadrature Q components for a defective or faulty induction motor in accordance with some embodiments of the disclosure. The frequency domain plot 700 illustrates a large frequency component at frequency F1 for the Q component. The superimposed spectra of the D and Q components in the plot 700 enable a user to visually detect defects in the motor 106 being tested. Different superimposed spectra may be displayed by the motor drive analyzer 104 in different embodiments of the disclosure, such as the superimposed spectra shown in FIG. 8, which will be discussed in more detail below. The specific frequency F1 at which a large component or "spike" in the frequency spectrum of the D or Q component may indicate the specific type of defect in the induction motor 106 (FIG. 1) being tested. For example, for an induction motor including an electrically short-circuited stator winding, a spike may appear in the frequency spectra of the D or Q components in the frequency range from 1K Hz to 10K Hz, and are especially clear below 10 Hz with amplitudes approximately of 0.3 mV. All of these types of harmonics in the D and Q frequency spectra are due to rotor and stator slot composition fluxes.

Figure 8:
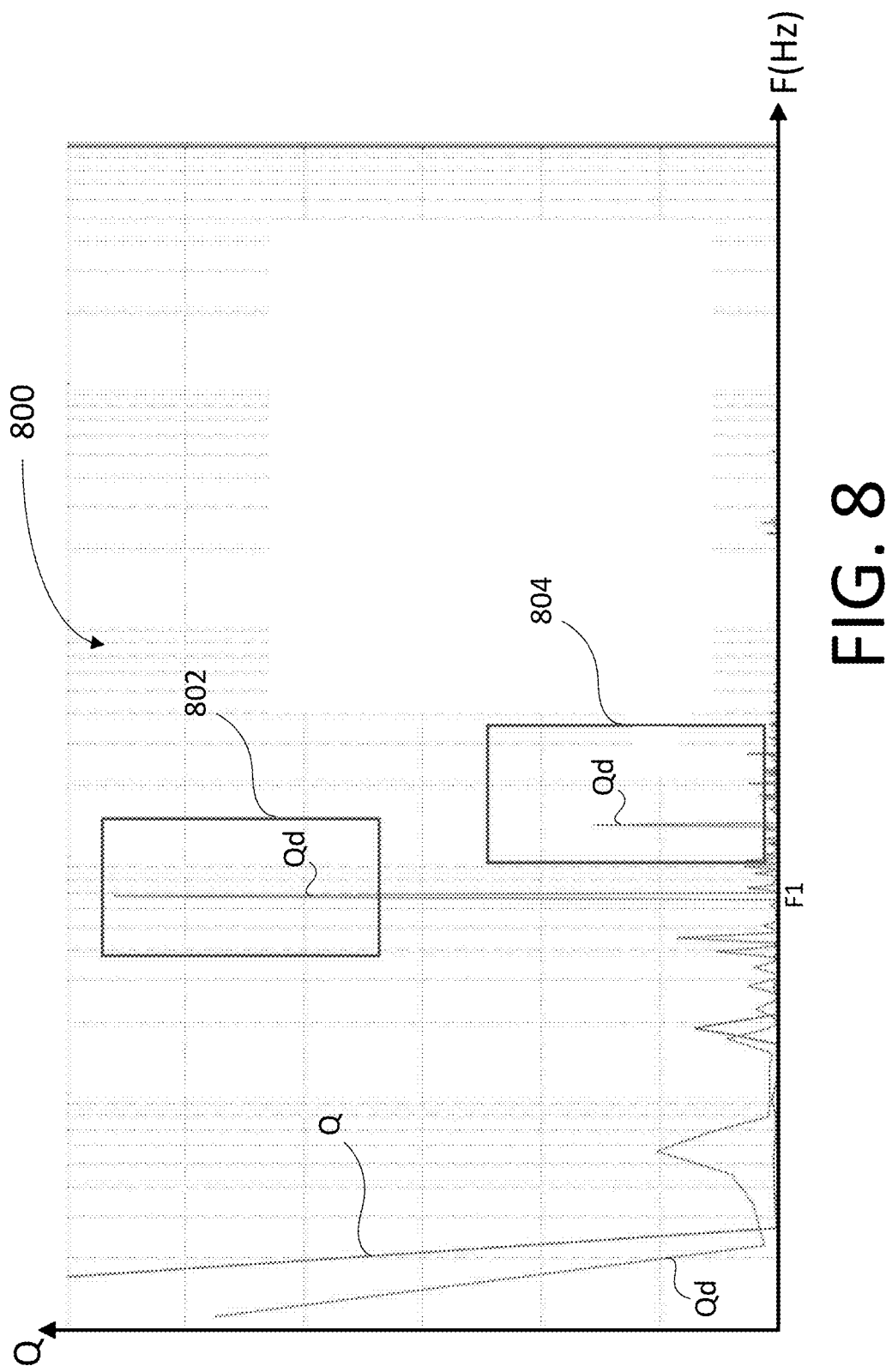
FIG. 8 is a plot generated by motor drive analyzer of FIG. 1 illustrating the frequency spectra of the quadrature component for a defective induction motor and a healthy induction motor in accordance with some embodiments of the disclosure.

FIG. 8 is a frequency domain plot 800 generated by motor drive analyzer 104 of FIG. 1 illustrating the frequency spectra of the Q component for a defective induction motor and a healthy induction motor in accordance with some embodiments of the disclosure. The frequency spectrum for the Q component of the healthy motor is designated Q and the Q component of the defective motor is designated as Qd in the plot 800. Spikes 802 and 804 in the frequency spectrum Qd indicate defects in the motor 104 being tested. In contrast, no such spikes are present in the frequency spectrum Q, indicating the motor for which this Q component was generated is a healthy motor. The superimposed spectra of the Q spectrum, which could be used as a sort of template for known good motor 106 of a type or model, and the Qd spectrum enables a user to visually detect defects through the plot 800.

The motor drive analyzer 104 may generate the frequency domain plots for D, Q, and Z components in different ways. In one example embodiment, the motor drive analyzer 104 generate the frequency spectrum for these components through the following equations:

$$fDspectra = FFT(D(t)) \qquad \text{EQN 3}$$

$$fQspectra = FFT(Q(t)) \qquad \text{EQN 4}$$

$$fZspectra = FFT(Z(t)) \qquad \text{EQN 5}$$

where the signals D(t), Q(t), and Z(t) correspond to the time-domain D, Q, and Z components calculated from the drive signals Va, Vb, Vc (Ia, Ib, Ic) in the ABC reference frame and the FFT is the Fast Fourier Transform of these time-domain signals. The motor drive analyzer 104 may utilize the DFT in alternative embodiments.

The most common stator faults in an induction motor relate to the coil turns or windings forming the coils of the stator, and specifically to electrical short circuits between windings in either an end portion or a slot portion of each coil. Such faults or defects appear in certain frequency ranges or at specific frequencies in the frequency domain plots generated by the motor drive analyzer 104. The use of these frequency domain plots improves the detection of motor defects involving generation of particular frequency components when a defect is present.

The conventional approach for detecting such stator faults involves identifying whether frequency components indicating such a fault are present in the drive signals. The frequency components of interest are given by formula $$f = f1\frac{nZr(1-s)}{p} + / - k$$

where f is the radial force harmonic frequency in hertz (Hz), f1 is a frequency of the three-phase current drive signals Ia, Ib, Ic applied to the stator, n is an integer (n=1, 2, 3 . . . ), Zr is the number of slots of the rotor, "s" is slip of the motor, 'p' is number of poles of the motor, and k is an odd integer (k=1, 3, 5 . . . (2p−1)). The drawbacks to this conventional approach are that due to the transient nature of the signals being processed, the utilization of the above formula works well for k=1 but does not work well for other values of k (i.e., for other harmonics of the frequency f). In the formula above, the slots Zr, slip s, and poles p are standard parameters associated with induction motors and will be understood by those skilled in the art. Briefly, the slots Zr are regions of the stator between projections on the stator around which coils of the stator are wound, slip s is a parameter relating to the difference between the rotational speed of the rotor and the speed of the rotating magnetic field of the stator, and the poles p is the number of magnetic poles of the stator for each drive signal or phase of the induction motor.

Figure 9B:
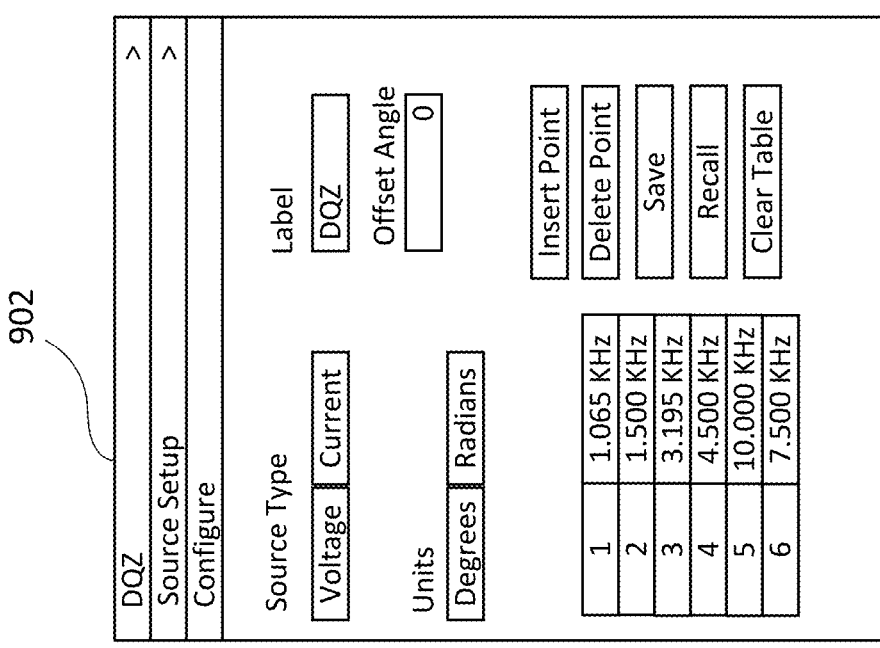
FIGS. 9A and 9B illustrate displays of a graphical user interface provided by the motor drive analyzer of FIG. 1 to allow a user to configure generation of the direct and quadrature plots of FIGS. 5 and 6 and the frequency spectra plots of FIGS. 7 and 8.
Figure 9A:
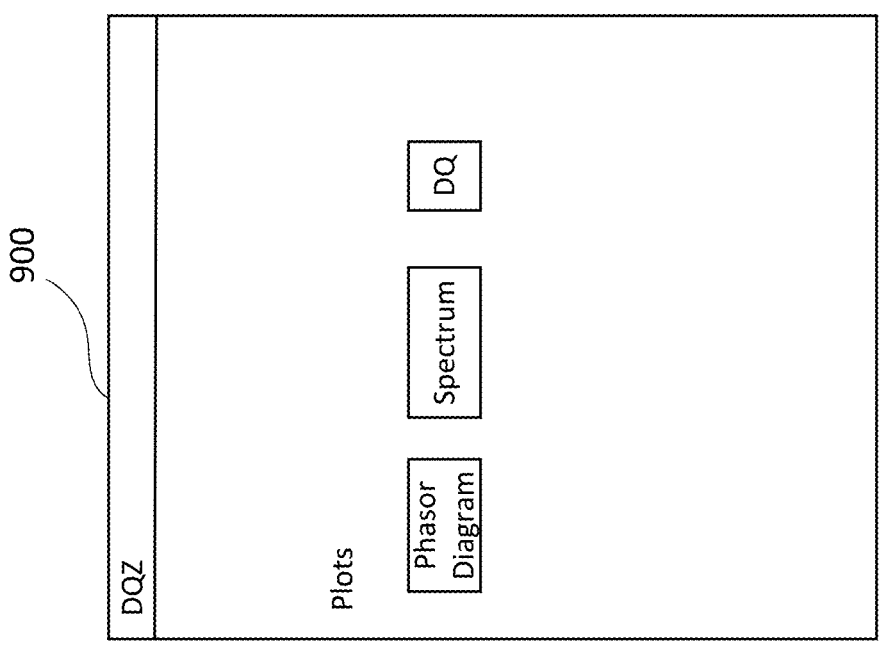

FIGS. 9A and 9B illustrate displays 900 and 902 of a graphical user interface provided by the motor drive analyzer of FIG. 1 to allow a user to configure generation of the DQ plots of FIGS. 5 and 6 and frequency spectra plots of FIGS. 7 and 8. In the display 900, a user is provided with options to select phasor diagram plots, frequency spectrum plots, or DQ plots for generation by the motor drive analyzer 104. Phasor diagram plots of the D, Q, and Z components are discussed in more detail below with reference to FIG. 10. The display 902 allows a user to select specific frequencies or frequency bands of interest for the frequency spectrum plots. This selection of particular frequencies or frequency bands of interest enables the test and measurement instrument 102 which the motor drive analyzer 104 is implemented to provide better scale for the frequency domain plots and improves the frequency analysis of the D, Q, and Z components.

Figure 10:
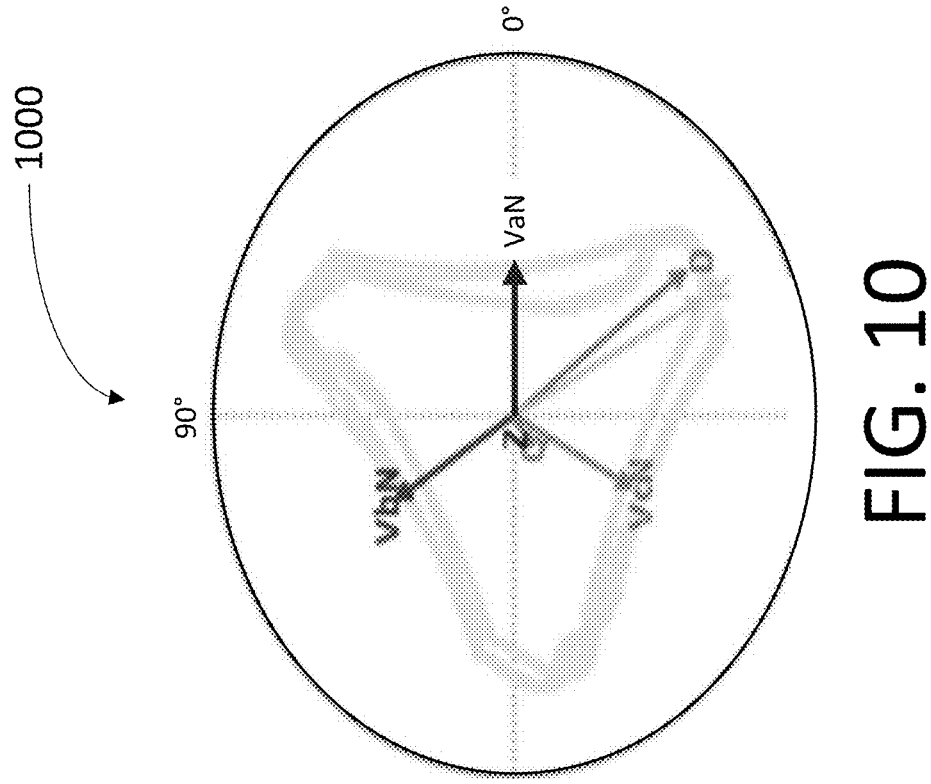
FIG. 10 is a phasor diagram plot generated by the motor drive analyzer of FIG. 1 that illustrates the direct, quadrature, and zero components for a defective induction motor in accordance with some embodiments of the disclosure.

FIG. 10 is a two-dimensional polar plot or phasor diagram plot 1000 generated by the motor drive analyzer 104 that illustrates the D, Q, and Z components for a defective induction motor in accordance with some embodiments of the disclosure. The triangular shape of phasor diagram plot 1000 is indicative of a defective motor 106 (FIG. 1) being tested. For a healthy motor 106, the phasor diagram plot 1000 would have a more circular shape instead of the triangular shape of FIG. 10. Accordingly, the phasor diagram plot 1000 is another plot provided by the motor drive analyzer 104 to enable a user to detect whether a motor 106 being tested is a defective or healthy motor.

Figure 11:
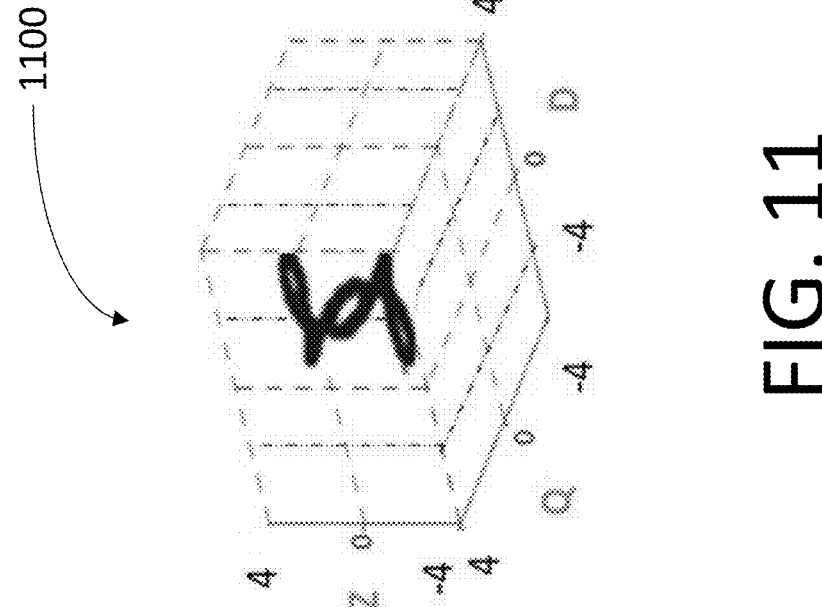
FIG. 11 is a three-dimensional plot generated by the motor drive analyzer of FIG. 1 that is a three-dimensional plot illustrating the direct, quadrature, and zero components for an induction motor in accordance with some embodiments of the disclosure.

FIG. 11 is an example of a DQZ plot 1100 that may be generated by the motor drive analyzer 104 of FIG. 1 in accordance with some embodiments of the disclosure. The DQZ plot was discussed above, but only two-dimensional DQ plots 500 and 600 were illustrated in FIGS. 5 and 6. FIG. 11 merely provides an example of a three-dimensional DQZ plot 1100 that may be generated by the motor drive analyzer 104 in some embodiments of the disclosure. The DQZ plot 1100 may, in some instances, improve or simplify detection by the user of defects in the motor 106 being tested.

Figure 12:
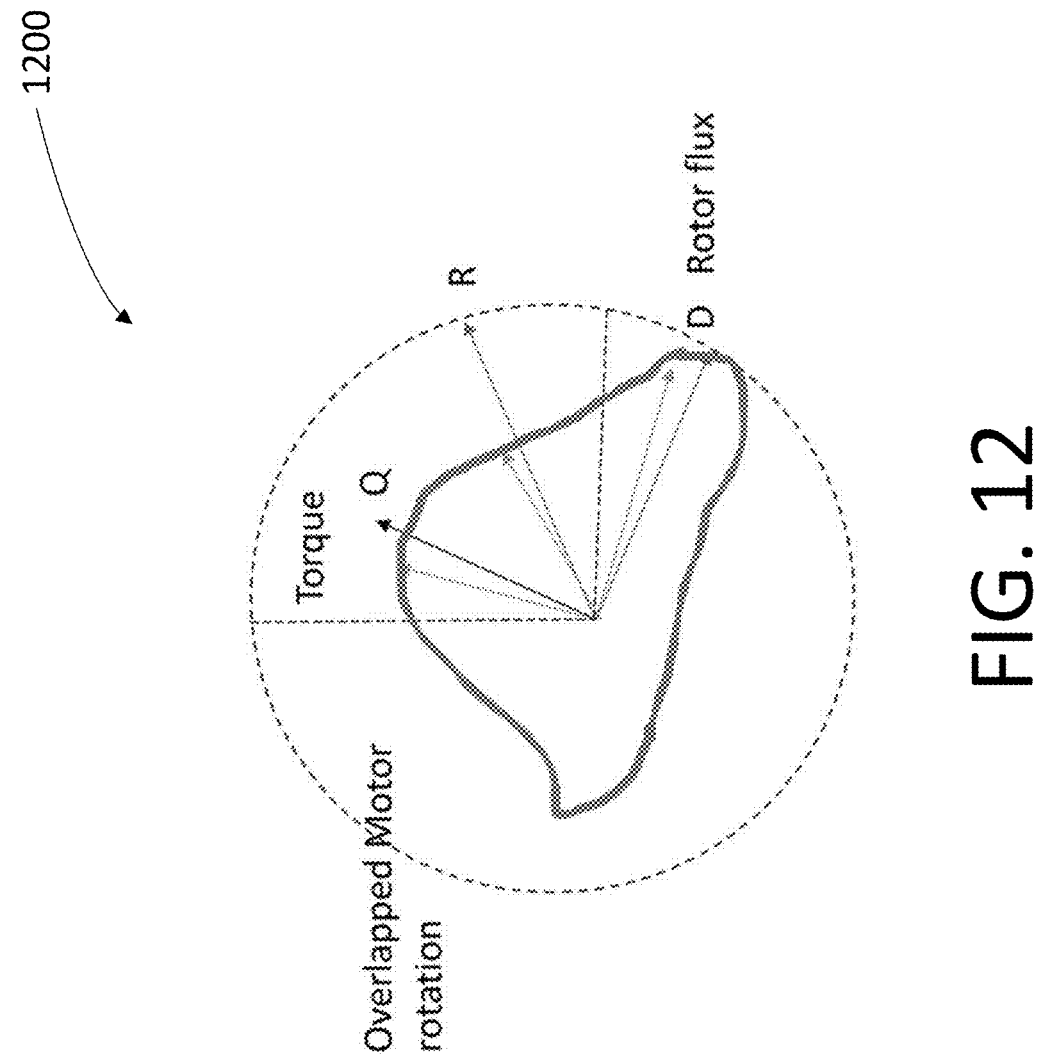
FIG. 12 is a plot illustrating an overlapped direct (D), quadrature (Q), and resultant (R) component phasor plot of healthy and defective motors generated by the motor drive analyzer of FIG. 1 in accordance with some embodiments of the disclosure.

FIG. 12 is a plot 1200 illustrating an overlapped direct (D), quadrature (Q), and resultant (R) component phasor plot of healthy and defective motors which is generated by the motor drive analyzer 104 of FIG. 1 in accordance with some embodiments of the disclosure. The resultant R is a resultant vector derived using the D and Q components. Aspects of the plot 1200, as well as the plot 1000 of FIG. 10 and the mask discussed above with reference to FIG. 5, are described in U.S. Patent App. Pub. No. 2022/0413051, filed Jun. 24, 2022, titled "SYSTEM AND METHOD FOR COMPUTING DIRECT QUADRATURE ZERO RESULTANT DRIVE VECTOR USING ROTOR POSITION," the contents of which are hereby incorporated by reference into this disclosure.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 is a test and measurement instrument, including one or more processors configured to acquire first, second, and third phase drive signals applied to a three-phase motor; a motor drive analyzer configured to: perform a direct-quadrature-zero, DQZ, transformation on the acquired first, second, and third phase drive signals to produce direct (D), quadrature (Q), and zero (Z) components; generate an overlapped DQ phasor plot illustrating the D and Q components; generate frequency domain representations of the D and Q components; and display, on the user interface, the generated overlapped DQ phasor plot and an overlapped DQ spectra plot from the frequency domain representations of the D and Q components to enable a user to detect defects in the induction motor through visual characteristics of the overlapped DQ phasor plot and visually displayed frequency components in the overlapped DQ spectra plot.

Example 2 is the test and measurement system of Example 1, wherein, prior to the motor drive analyzer generating the overlapped DQ phasor plot illustrating the D and Q components, the motor drive analyzer is further configured to: calculate an offset for each of the D and Q components; and remove the calculated offsets from the D and Q components to generate offset-adjusted D and Q components that are used to generate the overlapped DQ phasor plot.

Example 3 is the test and measurement system of Example 2, wherein the motor drive analyzer is further configured to filter the offset-adjusted D and Q components to generate filtered offset-adjusted D and Q components and to use the filtered offset-adjusted D and Q components to generate the overlapped DQ phasor plot.

Example 4 is the test and measurement system of Example 3, wherein the motor drive analyzer is further configured to generate a filtered offset-adjusted Z component and use the filtered offset-adjusted Z component to generate a three-dimensional overlapped DQZ phasor plot of the filtered and offset-adjusted D, Q, and Z components.

Example 5 is the test and measurement system of Example 1, wherein the three-phase motor comprises one of an AC motor and a brushless DC (BLDC) motor.

Example 6 is the test and measurement system of Example 5, wherein the three-phase motor comprises a three-phase induction motor.

Example 7 is the test and measurement system of Example 1, wherein the motor drive analyzer is further configured to identify, in response to user input, frequencies of interest in the generated frequency domain representations of the D and Q components.

Example 8 is the test and measurement system of Example 1, wherein the test and measurement instrument is an oscilloscope.

Example 9 is the test and measurement system of Example 1, wherein the motor drive analyzer generates frequency domain representations of the D and Q components by performing one of a Fast Fourier Transform (FFT) or a Discrete Fourier Transform (DFT) of the D and Q components.

Example 10 is the test and measurement system of Example 1, wherein the first, second, and third phase drive signals include AC voltage drive signals Va, Vb, Vc and AC current drive signals Ia, Ib, Ic.

Example 11 is the test and measurement system of Example 1, wherein the three-phase motor includes a rotor and a stator and wherein the user is able to detect, through the displayed DQ plot and frequency domain representations of the D and Q components, rotor defects including mechanical cracks in the rotor and stator defects including short circuited windings in coils of the stator.

Example 12 is a method of detecting defects in a three-phase motor, the method including acquiring first, second, and third phase drive signals applied to the motor; performing a direct-quadrature-zero, DQZ, transformation on the acquired first, second, and third phase drive signals to produce direct (D), quadrature (Q), and zero (Z) components; generating an overlapped DQ phasor plot illustrating the D and Q components; generating frequency domain representations of the D and Q components; and displaying for viewing by a user the generated overlapped DQ phasor plot and an overlapped DQ spectra plot from the frequency domain representations of the D and Q components to enable the user to detect defects in the induction motor through visual characteristics of the overlapped DQ phasor plot and visually displayed frequency components in the overlapped DQ spectra plot.

Example 13 is the method of Example 12, wherein generating the DQ plot illustrating the D and Q components further includes calculating an offset for each of the D and Q components; and removing the calculated offsets from the D and Q components to generate offset-adjusted D and Q components that are used to generate the overlapped DQ phasor plot.

Example 14 is the method of Example 13 further including filtering the offset-adjusted D and Q components to generate filtered offset-adjusted D and Q components; and generating the overlapped DQ phasor plot using the filtered offset-adjusted D and Q components.

Example 15 is the method of Example 14 further comprising: generating a filtered offset-adjusted Z component; and generating a three-dimensional DQZ plot of the filtered offset-adjusted D, Q, and Z components.

Example 16 is a test and measurement system, including a three-phase motor; a three-phase power source to provide first, second, and third phase drive signals to the three-phase motor; and a test and measurement instrument including one or more processors configured to acquire the first, second, and third phase drive signals and including a motor drive analyzer, the motor drive analyzer configured, in order to enable detection of defects in the three-phase motor, to: perform a direct-quadrature-zero, DQZ, transformation on the acquired first, second, and third phase drive signals to produce direct (D), quadrature (Q), and zero (Z) components; generate an overlapped DQ phasor plot illustrating the D and Q components; generate frequency domain representations of the D and Q components; and display the generated overlapped DQ phasor plot and an overlapped DQ spectra plot from the frequency domain representations of the D and Q components to enable a user to detect defects in the three-phase motor through visual characteristics of the overlapped DQ phasor plot and visually displayed frequency components in the overlapped DQ spectra plot.

Example 17 is the test and measurement system of Example 16, wherein, prior to the motor drive analyzer generating the DQ plot illustrating the D and Q components, the motor drive analyzer is further configured to: calculate an offset for each of the D and Q components; and remove the calculated offsets from the D and Q components to generate offset-adjusted D and Q components that are used to generate the overlapped DQ phasor plot.

Example 18 is the test and measurement system of Example 17, wherein the motor drive analyzer is further configured to filter the offset-adjusted D and Q components to generate filtered offset-adjusted D and Q components and to use the filtered offset-adjusted D and Q components to generate the overlapped DQ phasor plot.

Example 19 is the test and measurement system of Example 20, wherein the test and measurement instrument is an oscilloscope.

Example 20 is the test and measurement system of Example 16, wherein the first, second, and third phase drive signals are DC drive signals.

The foregoing description has been set forth merely to illustrate example embodiments of disclosure and is not intended to be limiting. Since modifications of the disclosed embodiments incorporating the substance of the invention may occur to person skilled in the art, the invention should be construed to include everything within the scope of the invention.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement instrument, comprising:
one or more processors configured to acquire first, second, and third phase drive signals applied to a three-phase motor;
a motor drive analyzer configured to:
    perform a direct-quadrature-zero, DQZ, transformation on the acquired first, second, and third phase drive signals to produce direct (D), quadrature (Q), and zero (Z) components;
    generate an overlapped DQ phasor plot illustrating the D and Q components;
    generate frequency domain representations of the D and Q components; and
    display, on the user interface, the generated overlapped DQ phasor plot and an overlapped DQ spectra plot from the frequency domain representations of the D and Q components to enable a user to detect defects in the three-phase motor through visual characteristics of the overlapped DQ phasor plot and visually displayed frequency components in the overlapped DQ spectra plot.

2. The test and measurement instrument of claim 1, wherein, prior to the motor drive analyzer generating the overlapped DQ phasor plot illustrating the D and Q components, the motor drive analyzer is further configured to:
    calculate an offset for each of the D and Q components; and
    remove the calculated offsets from the D and Q components to generate offset-adjusted D and Q components that are used to generate the overlapped DQ phasor plot.

3. The test and measurement instrument of claim 2, wherein the motor drive analyzer is further configured to filter the offset-adjusted D and Q components to generate filtered offset-adjusted D and Q components and to use the filtered offset-adjusted D and Q components to generate the overlapped DQ phasor plot.

4. The test and measurement instrument of claim 3, wherein the motor drive analyzer is further configured to generate a filtered offset-adjusted Z component and use the filtered offset-adjusted Z component to generate a three-dimensional overlapped DQZ phasor plot of the filtered and offset-adjusted D, Q, and Z components.

5. The test and measurement instrument of claim 1, wherein the three-phase motor comprises one of an AC motor and a brushless DC (BLDC) motor.

6. The test and measurement instrument of claim 5, wherein the three-phase motor comprises a three-phase induction motor.

7. The test and measurement instrument of claim 1, wherein the motor drive analyzer is further configured to identify, in response to user input, frequencies of interest in the generated frequency domain representations of the D and Q components.

8. The test and measurement instrument of claim 1, wherein the test and measurement instrument is an oscilloscope.

9. The test and measurement instrument of claim 1, wherein the motor drive analyzer generates frequency domain representations of the D and Q components by performing one of a Fast Fourier Transform (FFT) or a Discrete Fourier Transform (DFT) of the D and Q components.

10. The test and measurement instrument of claim 1, wherein the first, second, and third phase drive signals include AC voltage drive signals Va, Vb, Vc and AC current drive signals Ia, Ib, Ic.

11. The test and measurement instrument of claim 1, wherein the three-phase motor includes a rotor and a stator and wherein the user is able to detect, through the displayed DQ plot and frequency domain representations of the D and Q components, rotor defects including mechanical cracks in the rotor and stator defects including short circuited windings in coils of the stator.

12. A method of detecting defects in a three-phase motor, the method comprising:
    acquiring first, second, and third phase drive signals applied to the motor;
    performing a direct-quadrature-zero, DQZ, transformation on the acquired first, second, and third phase drive signals to produce direct (D), quadrature (Q), and zero (Z) components;
    generating an overlapped DQ phasor plot illustrating the D and Q components;
    generating frequency domain representations of the D and Q components; and
    displaying for viewing by a user the generated overlapped DQ phasor plot and an overlapped DQ spectra plot from the frequency domain representations of the D and Q components to enable the user to detect defects in the induction motor through visual characteristics of the overlapped DQ phasor plot and visually displayed frequency components in the overlapped DQ spectra plot.

13. The method of claim 12, wherein generating the DQ plot illustrating the D and Q components further comprises:
calculating an offset for each of the D and Q components; and
removing the calculated offsets from the D and Q components to generate offset-adjusted D and Q components that are used to generate the overlapped DQ phasor plot.

14. The method of claim 13 further comprising:
filtering the offset-adjusted D and Q components to generate filtered offset-adjusted D and Q components; and
generating the overlapped DQ phasor plot using the filtered offset-adjusted D and Q components.

15. The method of claim 14 further comprising:
generating a filtered offset-adjusted Z component; and
generating a three-dimensional DQZ plot of the filtered offset-adjusted D, Q, and Z components.

16. A test and measurement system, comprising:
a three-phase motor;
a three-phase power source to provide first, second, and third phase drive signals to the three-phase motor; and
a test and measurement instrument including one or more processors configured to acquire the first, second, and third phase drive signals and including a motor drive analyzer, the motor drive analyzer configured, in order to enable detection of defects in the three-phase motor, to:
perform a direct-quadrature-zero, DQZ, transformation on the acquired first, second, and third phase drive signals to produce direct (D), quadrature (Q), and zero (Z) components;

generate an overlapped DQ phasor plot illustrating the D and Q components;
generate frequency domain representations of the D and Q components; and
display the generated overlapped DQ phasor plot and an overlapped DQ spectra plot from the frequency domain representations of the D and Q components to enable a user to detect defects in the three-phase motor through visual characteristics of the overlapped DQ phasor plot and visually displayed frequency components in the overlapped DQ spectra plot.

17. The test and measurement system of claim 16, wherein, prior to the motor drive analyzer generating the DQ plot illustrating the D and Q components, the motor drive analyzer is further configured to:
calculate an offset for each of the D and Q components; and
remove the calculated offsets from the D and Q components to generate offset-adjusted D and Q components that are used to generate the overlapped DQ phasor plot.

18. The test and measurement system of claim 17, wherein the motor drive analyzer is further configured to filter the offset-adjusted D and Q components to generate filtered offset-adjusted D and Q components and to use the filtered offset-adjusted D and Q components to generate the overlapped DQ phasor plot.

19. The test and measurement system of claim 16, wherein the test and measurement instrument is an oscilloscope.

20. The test and measurement instrument of claim 16, wherein the first, second, and third phase drive signals are DC drive signals.

* * * * *